United States Patent [19]

Birch

[11] 4,413,195

[45] Nov. 1, 1983

[54] TRANSISTOR-TRANSISTOR-LOGIC CIRCUITS HAVING IMPROVED BREAKDOWN PROTECTION CIRCUITRY

[75] Inventor: William A. Birch, Tempe, Ariz.

[73] Assignee: Motorola, Inc., Schaumburg, Ill.

[21] Appl. No.: 282,118

[22] Filed: Jul. 10, 1981

[51] Int. Cl.³ .................... H03K 3/013; H03K 17/16; H03K 19/088; H03K 19/20

[52] U.S. Cl. ................................. 307/456; 307/300; 307/443

[58] Field of Search ............... 307/456, 443, 454, 300, 307/200 A

[56] References Cited

U.S. PATENT DOCUMENTS

| | | | |
|---|---|---|---|
| 3,073,969 | 1/1963 | Skillen ................................. | 307/254 |
| 3,555,294 | 1/1971 | Treadway ......................... | 307/443 X |
| 4,045,689 | 8/1977 | Tietz .................................... | 307/456 |
| 4,131,808 | 12/1978 | Kuo .................................. | 307/443 X |
| 4,132,906 | 1/1979 | Allen .................................... | 307/443 |
| 4,330,723 | 5/1982 | Griffith ........................... | 307/443 X |

Primary Examiner—Larry N. Anagnos
Assistant Examiner—David R. Hudspeth
Attorney, Agent, or Firm—Vincent B. Ingrassia

[57] ABSTRACT

A transistor-transistor-logic circuit includes a discharge circuit coupled between the base of an output transistor and a reference potential. The discharge circuit includes a transistor whose base and collector terminals are resistively coupled to the base of the output transistor and whose collector terminal is resistively coupled to a reference potential. The emitter of the transistor is also coupled to the reference potential. The transistor in the discharge circuit appears as a finite impedance when the output transistor is on and provides a path for discharging the base-emitter charge storage while the output transistor is turned off. The resistor coupled between the collector of the bypass transistor and the reference potential provides a large but finite impedance path for leakage current in said output transistor. This prevents the output transistor from being turned on by the leakage current.

7 Claims, 3 Drawing Figures

– PRIOR ART –

TRANSISTOR-TRANSISTOR-LOGIC CIRCUITS HAVING IMPROVED BREAKDOWN PROTECTION CIRCUITRY

BACKGROUND OF THE INVENTION

1. Field of the Invention

This invention relates generally to high speed logic circuitry and, more particularly, to high speed transistor transistor logic (TTL) circuits having an improved output pulldown circuit.

2. Description of the Prior Art

Prior art TTL logic circuits include at least one interstage current drive transistor coupled between an output semiconductor device such as a transistor and a source of binary input logic signals. Typically, the output device is either in saturation or is turned off depending upon the conditions of the binary logic input signals.

The output terminal of a TTL circuit is generally coupled to the collector of an output transistor the potential of which may be one of two distinct logic levels. When the output transistor is in or near saturation, the output terminal will be at a binary zero level using positive logic. When the output transistor is turned off, its collector voltage increases and the voltage at the output terminal will rise from a binary zero level to a binary one level.

The time it takes for the output transistors to turn off depends to a large extent on the time required for the base charge to be removed or diverted from the base of the output transistor. This was accomplished using a single pulldown resistor connected between the base of the output transistor and some reference potential. When it was desired to turn the output transistor off, the conductive path through the pulldown resistor provided the necessary path for removing base drive from the output transistor and terminating its conduction.

The problem associated with this technique is that current will begin to flow in the pulldown resistor prior to the time that the input signals applied to the TTL circuit reach a level sufficiently high to drive the output transistor into or near saturation and switch the circuit output terminal from one to the other of its two states. This current flow in the pulldown resistor produces a corresponding unwanted reduction in the DC output voltage level in the absence of a proper binary signal condition at the input of the circuit. Thus, if extraneous noise signals are coupled to the input of the TTL circuit which is equipped with only a pulldown resistor to discharge the output device, corresponding unwanted fluctuations in the output voltage level will be produced when current flows in the pulldown resistor.

To improve the input/output transfer characteristic of TTL logic circuits and to provide a high degree of noise immunity, a bypass network may be coupled between the output device and a reference potential. The bypass network provides good turnoff drive for the output device and decreases spiking in the output signals for input voltages which are not sufficiently high to drive the output device into or near saturation. Such an arrangement is shown and described in U.S. Pat. No. Re. No. 27,804 reissued Oct. 30, 1973 entitled "Transistor-Transistor Logic Circuits Having Improved Voltage Transfer Characteristics" and assigned to the assignee of the present invention. This arrangement, however, is intended for use in circuits comprising high breakdown transistors (i.e., over 12 volts). However, advances in integrated circuit technology have resulted in integrated circuits of increased density having shallower junctions and/or higher doping concentrations all of which tend to reduce the breakdown voltage to, for example, 6 volts. If a voltage exceeding the breakdown voltage is applied to the output terminal of a TTL circuit equipped with the bypass circuit of U.S. Pat. No. Re. No. 27,804, a leakage current will flow from the collector of the output transistor through its base and into its emitter causing the output transistor to breakdown or snap back and possibly result in a latchup situation.

SUMMARY OF THE INVENTION

It is an object of the present invention to provide an improved transistor transistor logic (TTL) circuit.

It is a further object of the present invention to provide an improved TTL logic circuit including means for diverting leakage current from the base of an output transistor when the output transistor is off.

It is a still further object of the present invention to provide an improved TTL logic circuit including means for diverting leakage current from the base of an output transistor without significantly reducing switching speed of the circuit and without significantly degrading the circuit's transfer characteristic.

According to a broad aspect of the invention there is provided in a logic circuit having input means for receiving one or more binary logic signals, an output transistor having base, emitter, and collector terminals, and a current drive transistor coupled between the input means and the output transistor for providing turn on drive current for the output transistor when binary logic signals concurrently applied to the input means reach a determined logic level, the improvement comprising: a turn off drive transistor having an emitter, a base and a collector; a first resistor coupled between said collector of said turn off drive transistor and the base of said output transistor; a second resistor coupled between the base of said turn off drive transistor and the base of said output transistor, said turn off drive transistor and said first and second resistors providing a discharge path from the output transistor when the latter is turned on; and means coupled to said turn off drive transistor for sourcing leakage current away from said output transistor so as to prevent said output transistor from turning on due to said leakage current.

According to a further aspect of the invention there is provided in a circuit configuration employing a first transistor having base, emitter and collector electrodes and means for biasing said first transistor into conduction and means for turning off said first transistor, the improvement comprising: second transistor means having base, emitter and collector electrodes; first current limiting means intermediate said collector electrode of said second transistor and said base electrode of said first transistor; second current limiting means intermediate said base electrode of said second transistor and said base electrode of said first transistor, the emitter electrode of said second transistor being adapted to be coupled to a reference potential whereby said second transistor means and said current limiting means provide a discharge path from said base electrode of said first transistor when said first transistor is turned off by said turn off means; and third current limiting means adapted to be coupled between said collector electrode of said second transistor and said reference potential for providing a current path to said reference potential for leakage current in said first transistor to prevent said first transistor from being turned on by said leakage current.

According to a still further aspect of the invention there is provided a transistor transistor logic circuit including in combination: input means for receiving binary logic signals; at least one output transistor having base, emitter and collector terminals; at least one current drive transistor having emitter, base and collector terminals with the base-emitter path thereof coupled between said input means and the base of said at least one output transistor, said one current drive transistor providing a turn-on drive current for said one output transistor when binary logic signals concurrently applied to said input means reach a predetermined logical level; resistance means adapted to be coupled between a voltage supply terminal and respective ones of said input means, said one current drive transistor, and said one output transistor for biasing same and biasing said one output transistor and said one current drive transistor non-conducting in the absence of binary logic signals at a predetermined logic level concurrently applied to said input means; a discharge circuit means including a transistor having its base and collector regions resistively connected to the base of said one output transistor and its emitter adapted to be connected to a reference potential, said collector region also being resistively coupled to said reference potential for supplying a current conducting path for leakage current in said at least one output transistor so as to prevent said at least one output transistor from turning on due to said leakage current.

The above and other objects, features and advantages of the present invention will be more clearly understood from the following detailed description taken in conjunction with the accompanying drawings, in which:

DESCRIPTION OF THE PREFERRED EMBODIMENT

Figure 1:
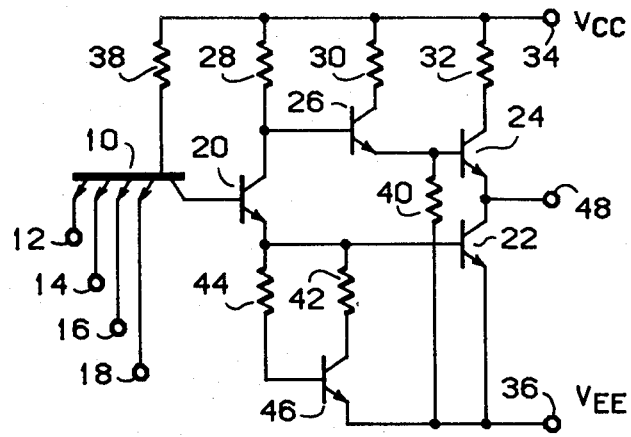
FIG. 1 is a schematic diagram of a TTL logic circuit in accordance with the prior art.

FIG. 1 is a schematic diagram of a TTL gate in accordance with the prior art. The circuit includes a multiple emitter input transistor 10 having input terminals 12, 14, 16 and 18 which are adapted to be coupled to sources of binary logic signals. A current drive transistor 20 has its base region coupled directly to the collector region of input transistor 10. Transistor 20 is referred to as a current drive transistor since it furnishes the base drive for output transistor 22 to which it is coupled.

The circuit of FIG. 1 also includes a second output transistor 24 coupled in a push/pull configuration with output transistor 22. A second current drive transistor 26 is coupled between the collector of transistor 20 and the base of output transistor 24. Transistor 26 provides base drive to output transistor 24 when the collector of transistor 20 swings from a low to a high potential. Collector load resistors 28, 30 and 32 are coupled to the collectors of transistors 20, 26 and 24 respectively to establish the desired current levels for proper circuit operation, and sources of collector and emitter potentials $V_{CC}$ and $V_{EE}$ are coupled respectively to voltage supply terminals 34 and 36.

The circuit shown in FIG. 1 includes a bypass network coupled between the base of transistor 22 and a point 36 of reference potential $V_{EE}$ which, in this case, is ground potential. The bypass circuit includes a resistor 44 coupled between the base of transistor 22 and the base of a transistor 46 which has an emitter coupled to $V_{EE}$. A resistor 42 is coupled between the base of transistor 22 and the collector of transistor 46.

Figure 3:
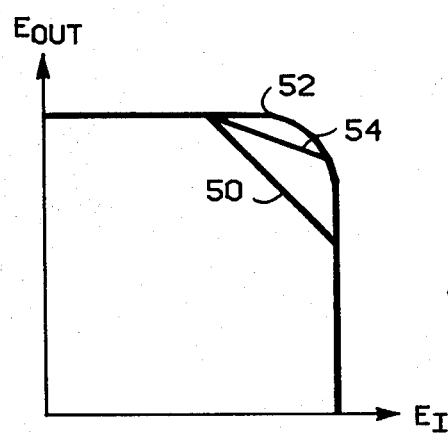
FIG. 3 illustrates the transfer characteristic for the circuits shown in FIGS. 1 and 2.

In order to fully understand the prior art circuit shown in FIG. 1, assume first that the bypass network including transistor 46 and resistors 42 and 44 is replaced by single pulldown resistor (not shown) coupled between the base of output transistor 22 and $V_{EE}$. If the input signals appearing at terminals 12, 14, 16, and 18 are not all a binary one, transistor 20 remains off and therefore no base drive is applied to output transistor 22 maintaining it off. However, transistor 26 applies base drive to transistor 24 which in turn causes current to flow through output terminal 48 to an external load (not shown). If, however, the binary signals applied to terminals 12, 14, 16 and 18 all swing sufficiently high to partially reverse bias the multiple emitter-base junction of input transistor 10, current is forced across the base-collector junction of transistor 10 and into the base of current drive transistor 20. Current will also flow through the above described pull down resistor. As transistor 32 turns on, the output voltage $E_{OUT}$ appearing at terminal 48 will fall. The decrease in output voltage $E_{OUT}$ which accompanies an increasing input voltage $E_{IN}$ is illustrated in FIG. 3. The portion 50 of the circuit voltage transfer characteristic $E_{IN}$ vs. $E_{OUT}$ is produced by current flowing in the single pulldown resistor.

In order to improve the input/output characteristic, the circuit was modified as is shown in FIG. 1; i.e., the single pulldown resistor was replaced by the bypass network including resistors 42 and 44 and transistor 46. Transistor 46 acts an infinite impedance when transistor 22 is on and provides a path for discharging the base-emitter charge storage when transistor 22 is turned off. When base drive is being supplied by transistor 20 to the base of output transistor 22 placing it in saturation and causing the output at terminal 48 to go low, a small amount of base current is supplied via resistor 44 to the base of transistor 46 sufficient to maintain it in the active region. Thus, when transistor 22 is turned off there is an immediately discharge of the base-emitter charge storage through transistor 46. This improves the input/output characteristic of the circuit shown in FIG. 1 as characterized by that portion of FIG. 3 denoted 52. As can be seen, the voltage transfer curve has been substantially squared.

Unfortunately, as described previously the circuit shown in FIG. 1 suffers from the disadvantage that no path is provided for leakage current through transistor 22 as a result of a high voltage being placed on output terminal 48. It was not considered necessary in the circuit shown in FIG. 1 since transistors were being built with sufficiently high breakdown voltages. However, with recent improvements in semiconductor process technology which yield circuits of higher density with shallower diffusion depths and/or high dopant concentrations, the breakdown voltages of the transistors have been substantially reduced. Without a means for diverting this leakage current, transistor 22 may be inadvertently turned on resulting in snap back and causing the transistor to latch up.

Figure 2:
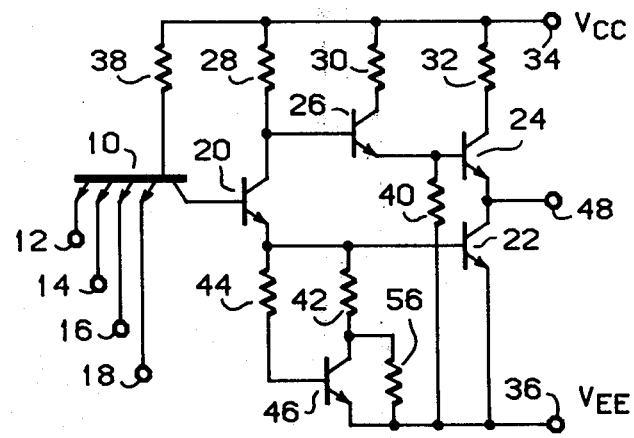
FIG. 2 is a schematic diagram of the inventive TTL logic circuit.

The inventive circuit shown in FIG. 2 solves this leakage current problem. As can be seen, a resistor 56 coupled between the collector of transistor 46 and ground has been added. Resistor 56 is relatively large; i.e., if resistor 42 is 5K ohms and resistor 44 is 3K ohms, then resistor 56 should be at least 15K ohms. When the base of transistor 22 is floating (when transistors 20, 22 and 46 are off, resistors 42 and 56 provide a path to ground for leakage current in transistor 22. This avoids the problem of latching due to breakdown without sacrificing the advantages of the prior art bypass network. That is, it has already been stated that in order to turn transistor 22 off quickly, its base current must be quickly diverted. When transistor 46 is on, resistor 56 is out of the circuit thereby providing the required quick discharge path.

Referring to FIG. 3, the voltage transfer characteristic of the inventive circuit is represented by portion 54. While there has been some sloping of the voltage characteristic, there has been no serious degradation. Further, the slope of portion 54 may be minimized by properly choosing the value of resistor 56 as compared with that of resistor 28.

In summary, the advantages of the single pulldown resistor and the bypass network have been combined into a single circuit in such a way as to take advantage of their individual characteristics only when needed.

The above description is given by way of example only. Changes in form and details may be made by one skilled in the art without departing from the spirit and scope of the invention.

I claim:

1. In a logic circuit having input means for receiving one or more binary logic signals, an output transistor having base, emitter, and collector terminals, an output terminal coupled to said collector terminal of said output transistor, and a current drive transistor coupled between the input means and the output transistor for providing turn on drive current for the output transistor when binary logic signals concurrently applied to the input means reach a determined logic level, the improvement comprising:
   a turn off drive transistor having an emitter, a base and a collector, said emitter of said turn off drive transistor being coupled to said emitter of said output transistor;
   a first resistor coupled between said collector of said turn off drive transistor and the base of said output transistor;
   a second resistor coupled between the base of said turn off drive transistor and the base of said output transistor, said turn off drive transistor and said first and second resistors providing a discharge path from the output transistor when the latter is turned on; and
   means coupled to said turn off drive transistor for sourcing leakage current away from said output transistor so as to prevent said output transistor from turning on due to said leakage current.

2. A logic circuit according to claim 1 wherein said means comprises a third resistor coupled in parallel with the collector-emitter path of said turn off drive transistor.

3. A circuit according to claim 2 wherein said third resistor has a resistance substantially larger than that of said first resistor.

4. In a circuit configuration employing a first transistor having base, emitter and collector electrodes and means for biasing said first transistor into conduction and means for turning off said first transistor, an output terminal coupled to said collector electrode of said first transistor, whereby the emitter electrode of said first transistor is connectible to a reference potential, the improvement comprising:
   second transistor means having base, emitter and collector electrodes;
   first current limiting means intermediate said collector electrode of said second transistor and said base electrode of said first transistor;
   second current limiting means intermediate said base electrode of said second transistor and said base electrode of said first transistor, the emitter electrode of said second transistor being connectible to said reference potential whereby said second transistor means and said current limiting means provide a discharge path from said base electrode of said first transistor when said first transistor is turned off by said turn off means; and
   third current limiting means connectible between said collector electrode of said second transistor and said reference potential for providing a current path to said reference potential for leakage current in said first transistor to prevent said first transistor from being turned on by said leakage current.

5. A circuit according to claim 4 wherein said first and third current limiting means are resistors and wherein said third current limiting means has a resistance substantially greater than that of said first current limiting means.

6. A transistor transistor logic circuit including in combination:
   input means for receiving binary logic signals;
   at least one output transistor having base, emitter and collector terminals;
   at least one current drive transistor having emitter, base and collector terminals with the base-emitter path thereof coupled between said input means and the base of said at least one output transistor, said one current drive transistor providing a turn-on drive current for said one output transistor when binary logic signals concurrently applied to said input means reach a predetermined logical level;
   resistance means being connectible between a voltage supply terminal and respective ones of said input means, said one current drive transistor, and said one output transistor for biasing same and biasing said one output transistor and said one current drive transistor non-conducting in the absence of binary logic signals at a predetermined logic level concurrently applied to said input means;
   a discharge circuit means including a transistor having its base and collector regions resistively connected to the base of said one output transistor and its emitter being connectible to a reference potential said collector region also being resistively coupled to said reference potential for supplying a current conducting path for leakage current in said at least one output transistor so as to prevent said at least one output transistor from turning on due to said leakage current.

7. A logic circuit according to claim 6 wherein said discharge circuit includes:
   a first resistor coupled between the collector of said first transistor and the base of said at least one output transistor;
   a second resistor coupled between the base of said first transistor and the base of said at least one output transistor; and
   a third resistor coupled between the collector of said transistor and said reference potential.

* * * * *